United States Patent
Alvi et al.

(10) Patent No.: US 11,723,168 B2
(45) Date of Patent: *Aug. 8, 2023

(54) BUSBAR ASSEMBLY FOR CURRENT SENSING

(71) Applicant: GM Global Technology Operations LLC, Detroit, MI (US)

(72) Inventors: Muhammad H. Alvi, Troy, MI (US); Rashmi Prasad, Troy, MI (US); Chandra S. Namuduri, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/838,653

(22) Filed: Jun. 13, 2022

(65) Prior Publication Data
US 2022/0304180 A1   Sep. 22, 2022

Related U.S. Application Data

(63) Continuation of application No. 17/153,455, filed on Jan. 20, 2021, now Pat. No. 11,395,430.

(51) Int. Cl.
*H05K 7/00* (2006.01)
*H05K 7/14* (2006.01)

(52) U.S. Cl.
CPC ......... *H05K 7/1429* (2013.01); *H05K 7/1472* (2013.01); *H05K 2201/10272* (2013.01)

(58) Field of Classification Search
CPC ............... H05K 7/1429; H05K 7/1472; H05K 2201/10272
See application file for complete search history.

(56) References Cited

U.S. PATENT DOCUMENTS

| | | | |
|---|---|---|---|
| 5,717,327 A | 2/1998 | Bradford | |
| 11,280,813 B2 | 3/2022 | Hebiguchi et al. | |
| 2009/0121704 A1 | 5/2009 | Shibahara | |
| 2018/0368249 A1* | 12/2018 | Chin | H05K 1/0263 |
| 2018/0375307 A1* | 12/2018 | Kita | B60R 16/0239 |
| 2020/0267841 A1* | 8/2020 | Lee | H05K 1/181 |

* cited by examiner

*Primary Examiner* — Pete T Lee
(74) *Attorney, Agent, or Firm* — Vivacqua Crane PLLC

(57) ABSTRACT

A busbar assembly includes a base having a width and a length. The base has a first surface and a second surface and has a first side and a second side. A distance between the first side and the second side comprises the width, and the base defines a slot centered between approximately 75% and approximately 79% of the width.

14 Claims, 4 Drawing Sheets

BUSBAR ASSEMBLY FOR CURRENT SENSING

CROSS-REFERENCE TO RELATED APPLICATIONS

This application is a continuation of U.S. application Ser. No. 17/153,455 filed Jan. 20, 2021. The disclosure of the above application is incorporated herein by reference.

INTRODUCTION

The present disclosure relates to busbar assemblies, and more particularly to busbar assemblies for current sensing.

Vehicles, such as battery-electric vehicles (BEVs), plug-in hybrid-electric vehicles (PHEVs), mild hybrid-electric vehicles (MHEVs), or full hybrid-electric vehicles (FHEVs), may contain one or more energy storage devices, such as a high voltage (HV) battery, that functions as a propulsion source for the vehicle. The HV battery may include components and systems to assist in managing vehicle performance and operations. The HV battery may also include one or more arrays of battery cells interconnected electrically between battery cell terminals and interconnector busbars

SUMMARY

According to several aspects of the present disclosure, a busbar assembly includes a base having a width and a length. The base has a first surface and a second surface and has a first side and a second side. A distance between the first side and the second side comprises the width, and the base defines a slot centered between approximately 75% and approximately 79% of the width.

In other features, the base defines the slot centered between approximately 76% and approximately 78% of the width.

In other features, the base defines the slot centered at 77% of the width.

In other features, the slot comprises an aperture extending through the base.

In other features, the base further defines a channel between the first side and the second side.

In other features, the busbar assembly includes a printed circuit board disposed over the first surface, wherein a flanged portion of the printed circuit board extends through the channel, where the flanged portion includes at least one current sensing device configured to measure current parameters of current flow through the base.

In other features, the at least one current sensing device comprises a point field detector.

In other features, the at least one current sensing device is galvanically isolated from the base.

In other features, the width is at least four times the thickness.

According to several aspects of the present disclosure, busbar assembly includes a base having a width and a length, the base having a first surface and a second surface and having a first side and a second side. A distance between the first side and the second side comprises the width of the base, and the base defines a slot centered between approximately 75% and approximately 79% of the width. The busbar assembly includes a printed circuit board disposed over the first surface. A flanged portion of the printed circuit board extends through a channel, and the flanged portion includes at least one current sensing device configured to measure current parameters of current flow through the base.

In other features, the base defines the slot centered between approximately 76% and approximately 78% of the width.

In other features, the base defines the slot centered at 77% of the width.

In other features, the slot comprises an aperture extending through the base.

In other features, the base further defines the channel between the first side and the second side.

In other features, the at least one current sensing device comprises a point field detector.

In other features, the at least one current sensing device is galvanically isolated from the base.

In other features, the width is at least four times a thickness of the base.

According to several aspects of the present disclosure, busbar assembly includes a base having a width and a length, the base having a first surface and a second surface and having a first side and a second side. A distance between the first side and the second side comprises the width of the base. The base defines a slot centered between approximately 75% and approximately 79% of the width and the width is at least four times a thickness of the base. The busbar assembly includes a printed circuit board disposed over the first surface. A flanged portion of the printed circuit board extends through a channel, and the flanged portion includes at least one current sensing device configured to measure current parameters of current flow through the base.

In other features, the base defines the slot centered between approximately 76% and approximately 78% of the width.

In other features, the base defines the slot centered at 77% of the width.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses.

In some vehicle environments, busbars are used within vehicle battery assemblies, e.g., battery packs, to provide for local current power distribution. In some implementations, busbars may incorporate current sensing capabilities for control and protection of electronic components. However, current busbars may fail to provide suitable current sensing capabilities due to external disturbances, lack of galvanic isolation, and frequency dependent skin and proximity effects. As discussed herein, a busbar assembly can include a single slot that is asymmetrically centered to allow one or more current sensing devices to access and measure differential fields. Based on the configuration of the single slot, the one or more current sensing devices are also galvanically isolated from a base of the busbar.

The positioning of the single slot within the busbar assembly can allow for sensing of magnetic fields that have minimal frequency dependency. In other words, the position of the slot can provide a spatial position within the busbar assembly that is appropriate for sensing a magnetic field and/or current ranging from current having direct current (DC) characteristics to current having a frequency characteristic up to ten (10) megahertz (MHz).

Figure 1:
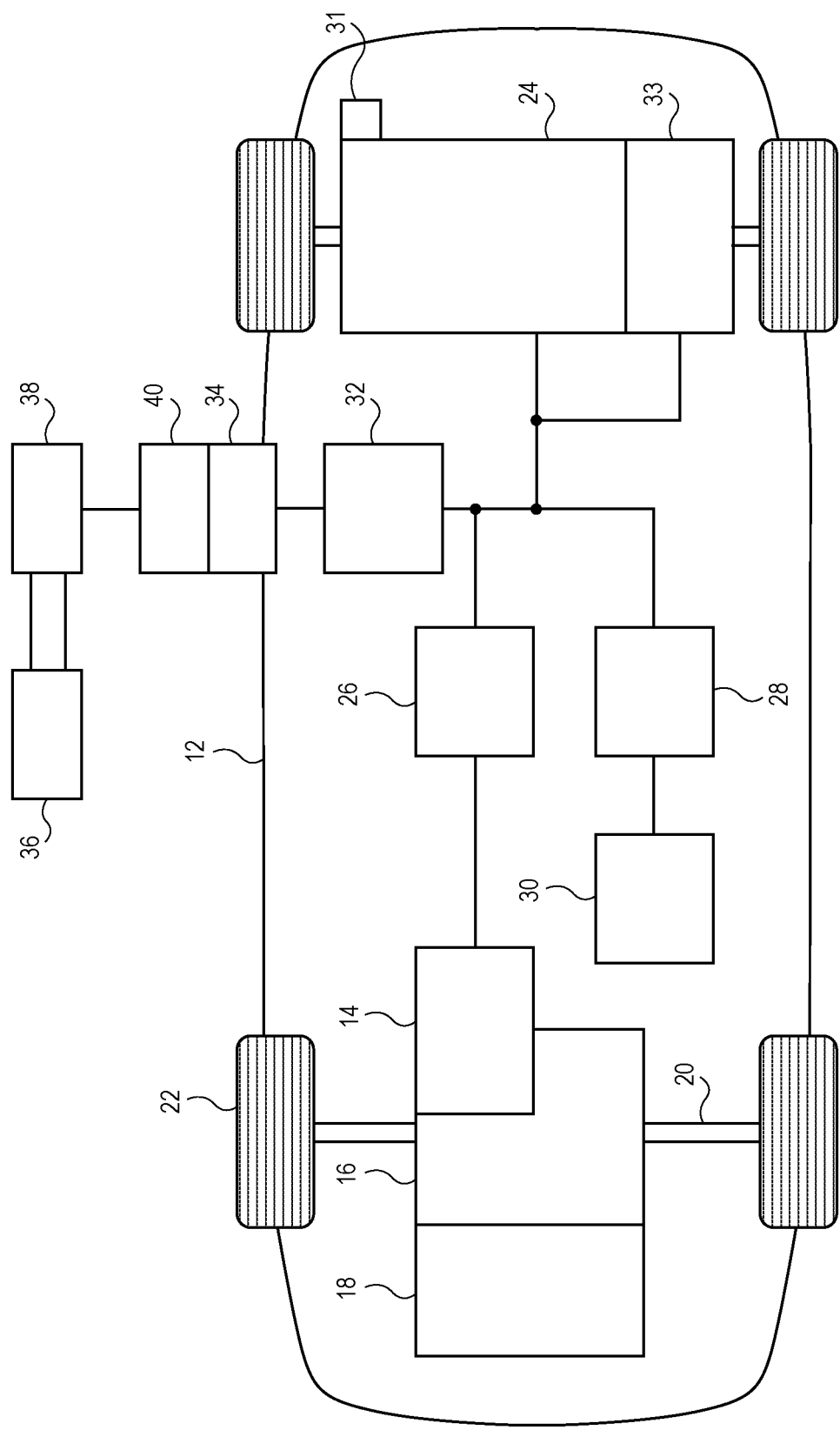
FIG. 1 is a schematic diagram of an example battery electric vehicle according to an example implementation.

FIG. 1 depicts a schematic of an example of a plug-in hybrid-electric vehicle (PHEV). A vehicle 12 may include one or more electric machines 14 mechanically connected to a hybrid transmission 16. The electric machines 14 may be capable of operating as a motor and/or a generator. In addition, the hybrid transmission 16 can be mechanically connected to an engine 18. The hybrid transmission 16 can also be mechanically connected to a drive shaft 20 that is mechanically connected to the wheels 22. The electric machines 14 can provide propulsion and deceleration capability when the engine 18 is turned on or off. The electric machines 14 may also function as generators and can provide fuel economy benefits by recovering energy that would normally be lost as heat in the friction braking system.

A traction battery 24, e.g., a battery pack, stores and provides energy that can be used by the electric machines 14 or other vehicle 12 components. The traction battery 24 typically provides a high voltage DC output from one or more battery cell arrays, sometimes referred to as battery cell stacks, within the traction battery 24. The high voltage DC output may also be converted to a low voltage DC output for applications such as vehicle stop/start. The battery cell arrays may include one or more battery cells. The traction battery 24 may be electrically connected to one or more power electronics modules 26 through one or more contactors. The one or more contactors isolate the traction battery 24 from other components when opened and connect the traction battery 24 to other components when closed. The power electronics module 26 is also electrically connected to the electric machines 14 and provides the ability to bi-directionally transfer electrical energy between the traction battery 24 and the electric machines 14. For example, a typical traction battery 24 may provide a DC voltage while the electric machines 14 may require a three-phase AC voltage to function. The power electronics module 26 may convert the DC voltage to a three-phase AC voltage as required by the electric machines 14. In a regenerative mode, the power electronics module 26 may convert the three-phase AC voltage from the electric machines 14 acting as generators to the DC voltage required by the traction battery 24. The description herein may be applicable to a pure electric vehicle or other hybrid vehicles. For a pure electric vehicle, the hybrid transmission 16 may be a gear box connected to an electric machine 14 and the engine 18 may not be present.

In addition to providing energy for propulsion, the traction battery 24 may provide energy for other vehicle electrical systems. A typical vehicle electrical system may include a DC/DC converter module 28 that converts the high voltage DC output of the traction battery 24 to a low voltage DC supply that is compatible with other vehicle loads. Other high-voltage loads, such as compressors and electric heaters, may be connected directly to the high-voltage without the use of a DC/DC converter module 28. In a typical vehicle, the low-voltage systems are electrically connected to an auxiliary battery 30, e.g., 12V battery.

A battery electrical control module (BECM) 33 may be in communication with the traction battery 24. The BECM 33 may function as a controller for the traction battery 24 and may also include an electronic monitoring system that manages temperature and charge state of each of the battery cells. The traction battery 24 may have a temperature sensor 31, such as a thermistor or other temperature gauge. The temperature sensor 31 may be in communication with the BECM 33 to provide temperature data regarding the traction battery 24. The temperature sensor 31 may also be located on or near the battery cells within the traction battery 24. It is also contemplated that more than one temperature sensor 31 may be used to monitor temperature of the battery cells.

The vehicle 12 may be, for example, an electric vehicle such as a PHEV, a FHEV, a MHEV, or a BEV in which the traction battery 24 may be recharged by an external power source 36. The external power source 36 may be a connection to an electrical outlet. The external power source 36 may be electrically connected to electric vehicle supply equipment (EVSE) 38. The EVSE 38 may provide circuitry and controls to regulate and manage the transfer of electrical energy between the power source 36 and the vehicle 12. The external power source 36 may provide DC or AC electric power to the EVSE 38. The EVSE 38 may have a charge connector 40 for plugging into a charge port 34 of the vehicle 12. The charge port 34 may be any type of port configured to transfer power from the EVSE 38 to the vehicle 12. The charge port 34 may be electrically connected to a charger or on-board power conversion module 32. The power conversion module 32 may condition the power supplied from the EVSE 38 to provide the proper voltage and current levels to the traction battery 24. The power conversion module 32 may interface with the EVSE 38 to coordinate the delivery of power to the vehicle 12. The EVSE connector 40 may have pins that mate with corresponding recesses of the charge port 34.

The various components discussed may have one or more associated controllers to control and monitor the operation of the components. The controllers may communicate via a serial bus (e.g., Controller Area Network (CAN)) or via discrete conductors.

The battery cells, such as a prismatic cell, may include electrochemical cells that convert stored chemical energy to electrical energy. Prismatic cells may include a housing, a positive electrode (cathode) and a negative electrode (anode). An electrolyte may allow ions to move between the anode and cathode during discharge, and then return during recharge. Terminals may allow current to flow out of the cell for use by the vehicle. When positioned in an array with multiple battery cells, the terminals of each battery cell may be aligned with opposing terminals (positive and negative) adjacent to one another and a busbar may assist in facilitating a series connection between the multiple battery cells. The battery cells may also be arranged in parallel such that similar terminals (positive and positive or negative and negative) are adjacent to one another. For example, two battery cells may be arranged with positive terminals adjacent to one another, and the next two cells may be arranged with negative terminals adjacent to one another. In this example, the busbar may contact terminals of all four cells. The traction battery 24 may be heated and/or cooled using a liquid thermal management system, an air thermal management system, or other method as known in the art.

Figure 2A:
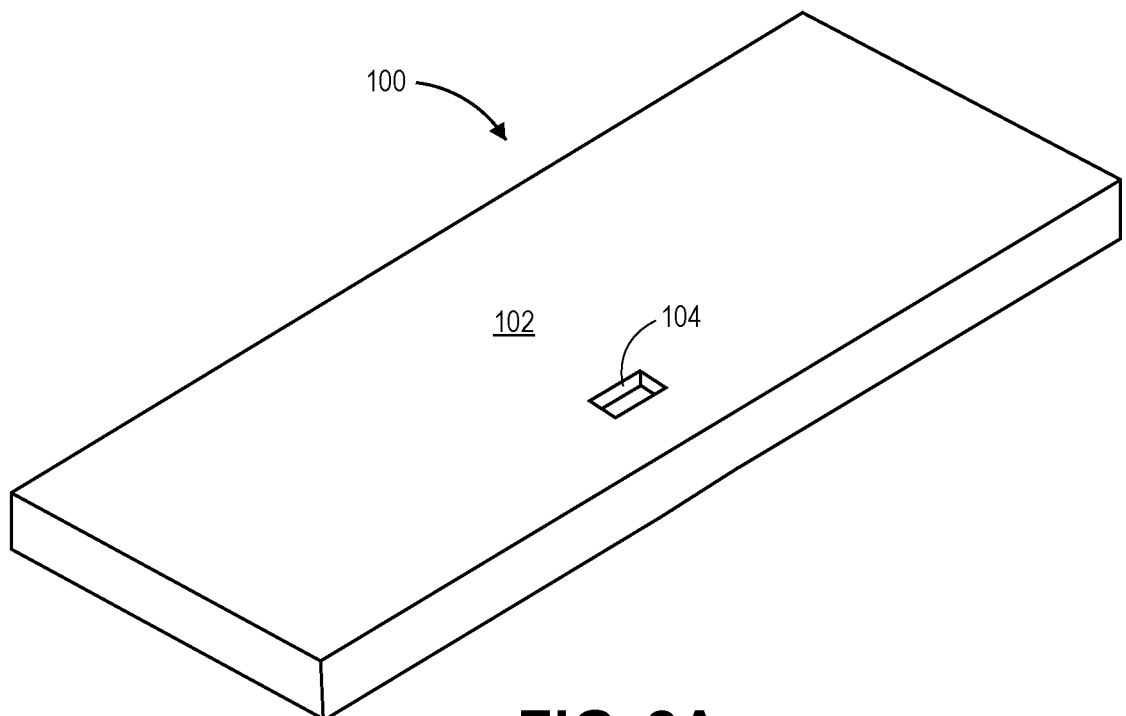
FIG. 2A is an isometric view of a busbar assembly according to an example implementation.
Figure 2B:
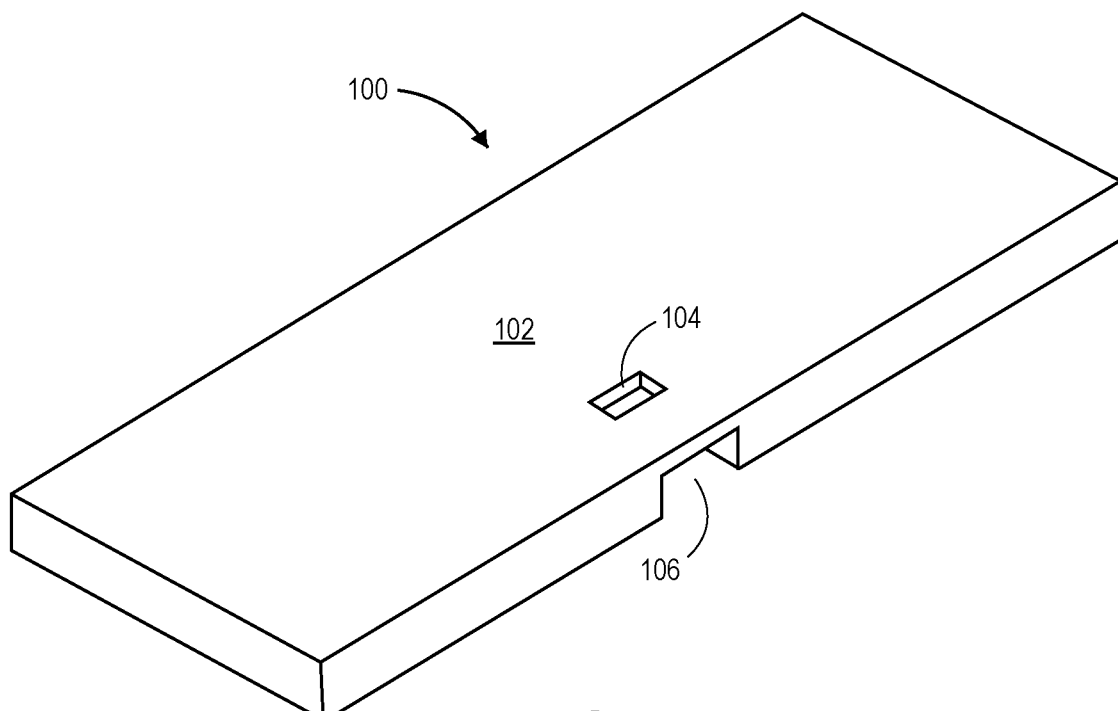
FIG. 2B is an isometric view of a busbar assembly according to an example implementation.

FIGS. 2A and 2B illustrate an example busbar assembly 100 according to an example implementation of the present disclosure. The busbar assembly 100 includes a base 102 and a single asymmetrically positioned slot 104 defined within the base 102, i.e., an aperture defined within the base 102. In various implementations, the busbar assembly 100 can span between a first battery cell and a second battery cell within the traction battery 24. The busbar assembly 100 may also be located between a battery, e.g., the traction battery 24, and other power electronics within the vehicle 12 and/or between a power electronics module and one or more electric machines 14. The busbar assembly 100 may be manufactured using a suitable metallic material to allow current flow. For example, the busbar assembly 100 may be comprised of copper, brass, and/or aluminum. The metallic material may include a first and a second generally planar surface. Referring to FIG. 2B, the busbar assembly 100 can define a channel 106 in some implementations as described in greater detail below.

Figure 3:
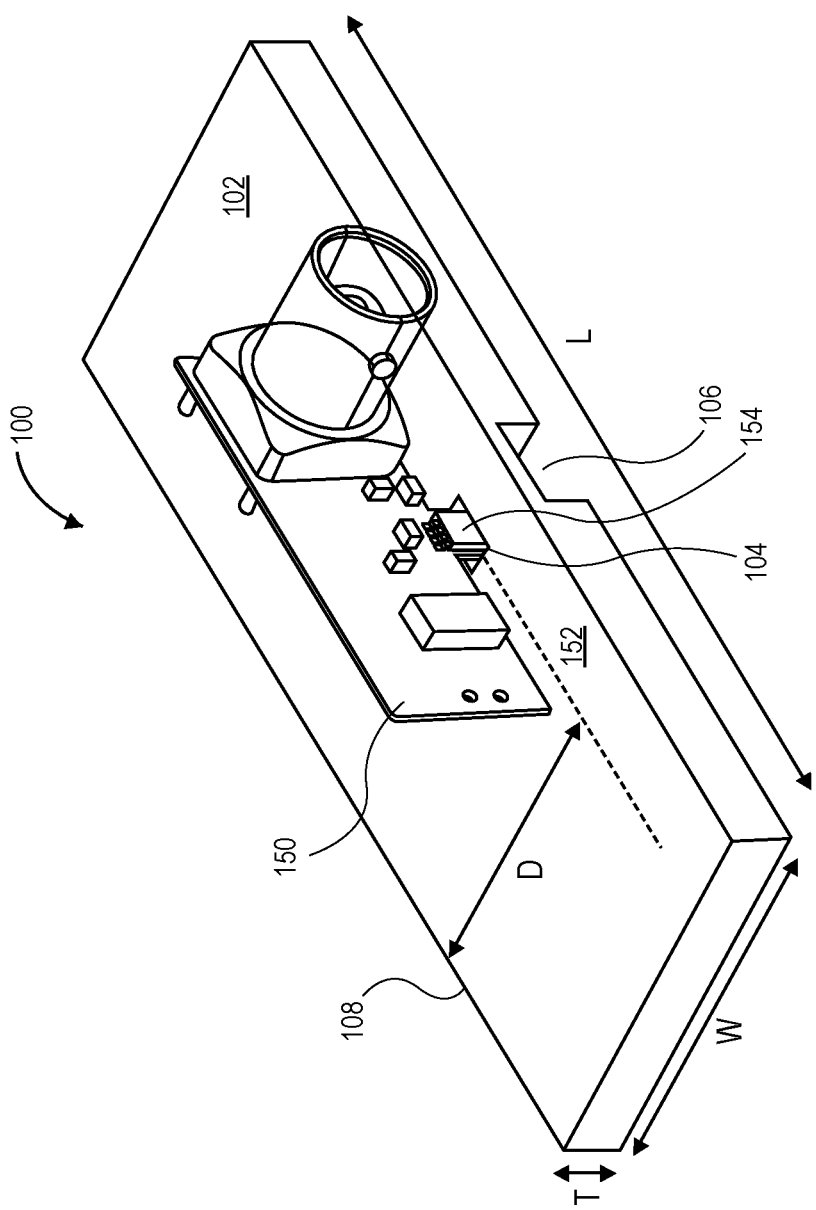
FIG. 3 is an isometric view of a busbar assembly including a printed circuit board disposed over a surface of the busbar assembly according to an example implementation.

Referring to FIG. 3, the base 102 of the busbar assembly 100 has a thickness (T), a width (W), and a length (L). The slot 104 can be asymmetrically centered within the base 102 between a range of approximately 75% and approximately 79% of the width as measured from a distal side 108 of the base 102, which is referred to as a distance D, i.e., a center point of the slot is positioned between approximately 75% and approximately 79% of the width as measured from the distal side 108. In an example implementation, the slot 104 can be centered within the base 102 such that the slot 104 is centered between approximately 76% and approximately 78% of the width as measured from the distal side 108. In another example implementation, the slot 104 can be centered within the base 102 at 77% of the width as measured from the distal side 108. In this context, the term "approximately" is known to those skilled in the art. Alternatively, the term "approximately" may be read to mean plus or minus 5%.

In some implementations, the width of the slot 104 may range between about two (2) millimeters (mm) and about four (4) millimeters (mm). In an example implementation, the width of the slot 104 may be three (3) millimeters (mm). The width of the base 102 may range between about fifteen (15) millimeters (mm) and about fifty (50) millimeters (mm). The thickness of the busbar assembly 100 can be a function of the width of the busbar assembly 100. In an example implementation, the width of the busbar assembly 100 is at least four (4) times the thickness of the busbar assembly 100 as defined in Equation 1:

$$W > 4*T \qquad \text{Eqn. 1}$$

Figure 4:
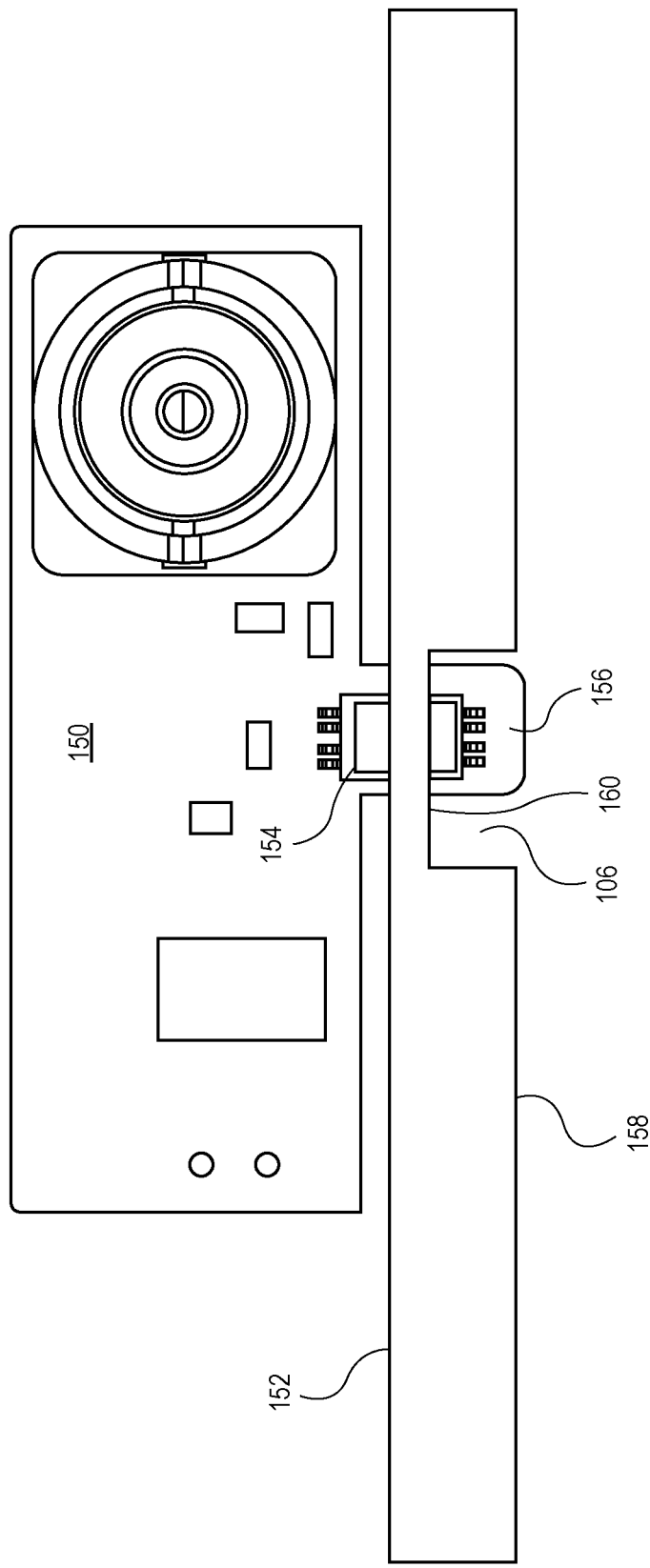
FIG. 4 is a side view of a busbar assembly including a printed circuit board disposed over a surface of the busbar assembly according to an example implementation.

Referring to FIG. 4, a printed circuit board 150 may be positioned over a generally planar surface 152 of the busbar assembly 100. A size of the printed circuit board 150 may vary based on the electronic modules and/or specialized sensing devices built in. The printed circuit board 150 can be attached, i.e., mounted, to the busbar assembly 100 via any suitable attachment techniques. For example, the printed circuit board 150 may be mounted to the busbar assembly 100 via one or more fasteners, e.g., screws, bolts, etc. A frame (not shown) to retain the printed circuit board 150 may also be attached to the busbar assembly 100. The printed circuit board 150 can include one or more electronic modules, e.g., components. As shown, the printed circuit board 150 can include one or more current sensing devices 154. The printed circuit board 150 can define a flanged portion 156 that extends outwardly away from the printed circuit board 150 and has a width that is less than a width of the printed circuit board 150.

As shown in FIGS. 3 and 4, the one or more current sensing devices 154 can be attached to the flanged portion 156. The flanged portion 156 may be integral with the printed circuit board 150 in some implementations. In other implementations, the flanged portion 156 is separate and can be attached to the printed circuit board 150 via one or more connectors. The width of the flanged portion 156 is less than a width of the slot 104 such that the flanged portion 156 and the one or more current sensing devices 154 can extend through the slot 104 when the printed circuit board 150 is attached to the busbar assembly 100.

The one or more current sensing devices 154 can comprise point field detectors (PFDs). The point field detectors can be used for high-bandwidth galvanically-isolated current sensing. The current sensing device 154 can measure current parameters, e.g., differential field parameters, corresponding to current flow through the busbar assembly 100. As shown in FIG. 4, the current sensing device 154 and the flanged portion 156 extend into the channel 106. Depending on a configuration of the busbar assembly 100, a thickness of the channel 106 can range between one (1) millimeter (mm) and two and a half (2.5) millimeters (mm). In these implementations, the current sensing device(s) 154 may extend beyond a generally planar surface 158 of the busbar assembly 100. The busbar assembly 100 can include the channel 106 when the thickness of the busbar assembly 100 is greater than a predetermined thickness.

While FIGS. 3 and 4 illustrate a single current sensing device 154, it is understood that two or more current sensing devices 154 can be attached to the printed circuit board 150. For example, a first current sensing device may be attached to the flanged portion 156 such that the first current sensing device is proximal to the surface 152, and a second current sensing device may be attached to the flanged portion 156 such that the second current sensing device extends beyond a surface 160 of the channel 106 and/or extends beyond the surface 158 when the base 102 does not defined a channel 106. It is understood that the busbar assembly 100 may be manufactured such that a cross-section of the busbar supports a range of current flow, e.g., ranging from about one hundred (100) Amperes (A) to about two thousand (2,000) Amperes.

Various components of the printed circuit board 150 may be connected to one or more controllers of the vehicle 12 such that the one or more controllers can receive the measurements from the one or more current sensing devices 154. The current sensing devices 154 may be used to sense DC current provided by the traction battery 24 and/or phase current for an inverter that is provided to the electric machines 14, e.g., motor and/or generator. While FIGS. 4 and 5 illustrate the non-flanged portion of the printed circuit board 150 as being generally perpendicular to the surface 152, in some example implementations, the non-flanged portion of the printed circuit board 150 may be generally parallel to the surface 152.

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:

1. A busbar assembly, comprising: a base having a width and a length, the base having a first surface and a second surface, the base having a first side and a second side, wherein a distance between the first side and the second side comprises the width, and wherein the base defines a slot centered between approximately 75% and approximately 79% of the width; wherein the base further defines a channel between the first side and the second side and a printed circuit board disposed over the first surface, wherein a flanged portion of the printed circuit board extends through the channel, the flanged portion including at least one current sensing device configured to measure current parameters of current flow through the base.

2. The busbar assembly of claim 1, wherein the base defines the slot centered between approximately 76% and approximately 78% of the width.

3. The busbar assembly of claim 1, wherein the base defines the slot centered at 77% of the width.

4. The busbar assembly of claim 1, wherein the slot comprises an aperture extending through the base.

5. The busbar assembly of claim 1, wherein the at least one current sensing device comprises a point field detector.

6. The busbar assembly of claim 1, wherein the at least one current sensing device is galvanically isolated from the base.

7. The busbar assembly of claim 1, wherein the width is at least four times a thickness of the base.

8. A busbar assembly, comprising: a base having a width and a length, the base having a first surface and a second surface, the base having a first side and a second side, wherein a distance between the first side and the second side comprises the width, wherein the base defines a slot centered between approximately 75% and approximately 79% of the width; and a printed circuit board disposed over the first surface, wherein a flanged portion of the printed circuit board extends through a channel, the flanged portion including at least one current sensing device configured to measure current parameters of current flow through the base; wherein the width is at least four times a thickness of the base.

9. The busbar assembly of claim 8, wherein the base defines the slot centered between approximately 76% and approximately 78% of the width.

10. The busbar assembly of claim 8, wherein the base defines the slot centered at 77% of the width.

11. The busbar assembly of claim 8, wherein the slot comprises an aperture extending through the base.

12. The busbar assembly of claim 8, wherein the base further defines the channel between the first side and the second side.

13. The busbar assembly of claim 8, wherein the at least one current sensing device comprises a point field detector.

14. The busbar assembly of claim 8, wherein the at least one current sensing device is galvanically isolated from the base.

* * * * *